(12) United States Patent
Fujita et al.

(10) Patent No.: US 12,407,321 B2
(45) Date of Patent: Sep. 2, 2025

(54) QUARTZ-CRYSTAL VIBRATING PIECE, CRYSTAL UNIT, CRYSTAL CONTROLLED OSCILLATOR, AND INTERMEDIATE WAFER FOR QUARTZ-CRYSTAL VIBRATING PIECE

(71) Applicant: NIHON DEMPA KOGYO CO., LTD., Tokyo (JP)

(72) Inventors: Tatsuya Fujita, Saitama (JP); Yukihiro Okajima, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 18/590,917

(22) Filed: Feb. 28, 2024

(65) Prior Publication Data

US 2024/0305264 A1    Sep. 12, 2024

(30) Foreign Application Priority Data

Mar. 9, 2023   (JP) ................................. 2023-036463

(51) Int. Cl.
| | |
|---|---|
| *H03H 9/02* | (2006.01) |
| *H03B 5/32* | (2006.01) |
| *H03H 9/05* | (2006.01) |
| *H03H 9/10* | (2006.01) |
| *H03H 9/19* | (2006.01) |

(52) U.S. Cl.
CPC .......... *H03H 9/02133* (2013.01); *H03B 5/32* (2013.01); *H03H 9/02157* (2013.01); *H03H 9/0557* (2013.01); *H03H 9/1021* (2013.01); *H03H 9/19* (2013.01)

(58) Field of Classification Search
CPC ........... H03H 9/02133; H03H 9/02157; H03H 9/0557; H03H 9/1021; H03H 9/19; H03B 5/32

See application file for complete search history.

(56) References Cited

U.S. PATENT DOCUMENTS

| | | | |
|---|---|---|---|
| 2004/0036380 A1* | 2/2004 | Oda ........................ | H03H 9/19 310/311 |
| 2014/0203689 A1* | 7/2014 | Obata ...................... | H03H 9/19 310/365 |

FOREIGN PATENT DOCUMENTS

JP   2001144578   5/2001

* cited by examiner

*Primary Examiner* — Jeffrey M Shin
(74) *Attorney, Agent, or Firm* — JCIPRNET (57) ABSTRACT

A quartz-crystal vibrating piece includes an element unit, excitation electrodes, and an extraction electrode. The element unit includes a vibrator, a first thick portion, and second thick portions. The vibrator has a quadrilateral shape in plan view, vibrates in a thickness-shear mode, and has a thickness t1. The first thick portion has a rectangular shape in plan view, has a short side connected to one side of the vibrator, extends in a first direction, and has a thickness t2 thicker than the thickness t1. The second thick portions are connected to both side surfaces of an end portion of the first thick portion in an opposite side of the vibrator. Each of the second thick portions extends along a second direction intersecting with the first direction and having a thickness t3 thicker than the thickness t1 and same as or different from the thickness t2.

12 Claims, 7 Drawing Sheets

FIG. 7D  FIG. 7E

QUARTZ-CRYSTAL VIBRATING PIECE, CRYSTAL UNIT, CRYSTAL CONTROLLED OSCILLATOR, AND INTERMEDIATE WAFER FOR QUARTZ-CRYSTAL VIBRATING PIECE

CROSS-REFERENCE TO RELATED APPLICATIONS

This application is based on and claims priority under 35 U.S.C. § 119 to Japanese Patent Application No. 2023-036463, filed on Mar. 9, 2023, the entire content of which is incorporated herein by reference.

TECHNICAL FIELD

This disclosure relates to a quartz-crystal vibrating piece appropriate for achieving a high frequency quartz crystal device, a crystal unit and a crystal controlled oscillator using the quartz-crystal vibrating piece, and an intermediate wafer for the quartz-crystal vibrating piece.

DESCRIPTION OF THE RELATED ART

In order to cope with increase of the volume of communication in information communication, it is required to further increase the communication speed. Therefore, higher frequencies are desired for piezoelectric devices that are reference signal sources of the information communication.

To attempt the higher frequency in a crystal unit and a crystal controlled oscillator that use a piezoelectric vibrating piece that vibrates in a thickness-shear mode, a thickness of a vibrator needs to be more and more thinned. However, when the thickness of the vibrator is thinned, an influence of, for example, a stress on the vibrator from a supporting portion that supports the piezoelectric vibrating piece is concerned.

To avoid this, for example, Japanese Unexamined Patent Application Publication No. 2001-144578 discloses a piezoelectric resonator with a structure designed for a high frequency piezoelectric device, for example, a frequency of 600 MHz. In the piezoelectric resonator, a vibrator formed of a thin piece and a supporting portion, which is provided along one side of an outer periphery of the vibrator and thicker than a plate thickness of the vibrator, are integrally formed (claim 1, FIG. 1, paragraph 2, and the like of Japanese Unexamined Patent Application Publication No. 2001-144578). According to the technique of Japanese Unexamined Patent Application Publication No. 2001-144578, since the thickness of the supporting portion can be configured to be any thickness regardless of an oscillation frequency, the thickness of the supporting portion can counteract the stress of deformation of a container, and the fluctuation of oscillation frequency can be avoided (paragraph 33 of Japanese Unexamined Patent Application Publication No. 2001-144578).

However, through the actual development of a high frequency piezoelectric device, for example, exceeding 400 MHz, as a high frequency piezoelectric device, the study by the inventor of this application has revealed that the further innovation is necessary.

A need thus exists for a quartz-crystal vibrating piece, a crystal unit, a crystal controlled oscillator, and an intermediate wafer for the quartz-crystal vibrating piece which are not susceptible to the drawback mentioned above.

SUMMARY

According to a first aspect of this disclosure, there is provided a quartz-crystal vibrating piece that includes an element unit, excitation electrodes, and an extraction electrode. The element unit includes a vibrator, a first thick portion, and second thick portions. The vibrator has a quadrilateral shape in plan view, vibrates in a thickness-shear mode, and has a thickness t1. The first thick portion has a rectangular shape in plan view, has a short side connected to one side of the vibrator, extends in a first direction, and has a thickness t2 thicker than the thickness t1. The second thick portions are connected to both side surfaces of an end portion of the first thick portion in an opposite side of the vibrator. Each of the second thick portions extends along a second direction intersecting with the first direction and has a thickness t3 thicker than the thickness t1 and same as or different from the thickness t2. The second thick portions are used for connecting the quartz-crystal vibrating piece to an external member. The excitation electrodes are disposed on both front and back sides of the vibrator. The extraction electrode is provided from the excitation electrode to the second thick portion via the first thick portion.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

The following describes embodiments of respective aspects of this application with reference to the drawings. Each drawing used in the description is merely illustrated schematically for understanding this disclosure. In each drawing used in the description, the same reference numeral is attached to the similar component, and its explanation is omitted in some cases. Shapes, materials, and the like described in the following explanations are merely preferable examples within the scope of this disclosure. Therefore, this disclosure is not limited to only the following embodiments.

1. Embodiment of Aspect of Quartz-Crystal Vibrating Piece

Figure 1A:
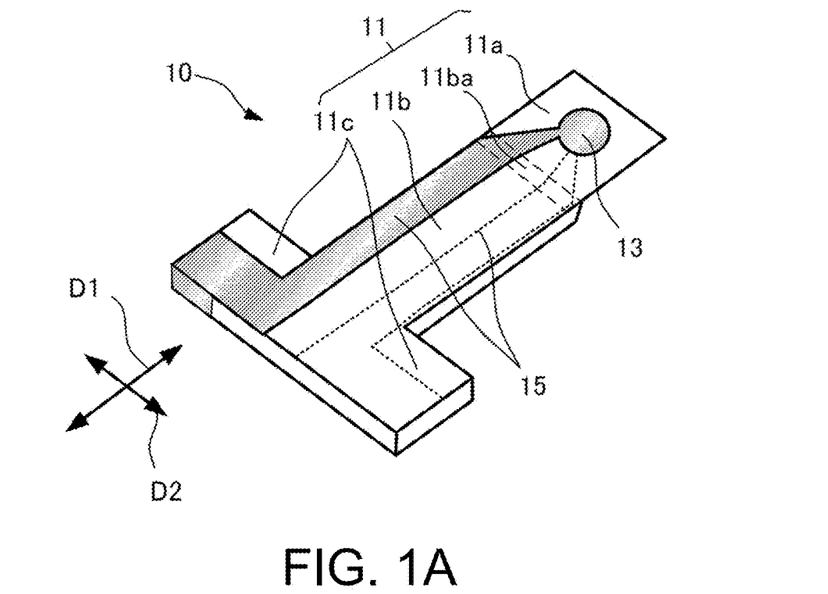
FIG. 1A to FIG. 1C are drawings for describing a quartz-crystal vibrating piece 10 of an embodiment of a first aspect.
Figure 1B:
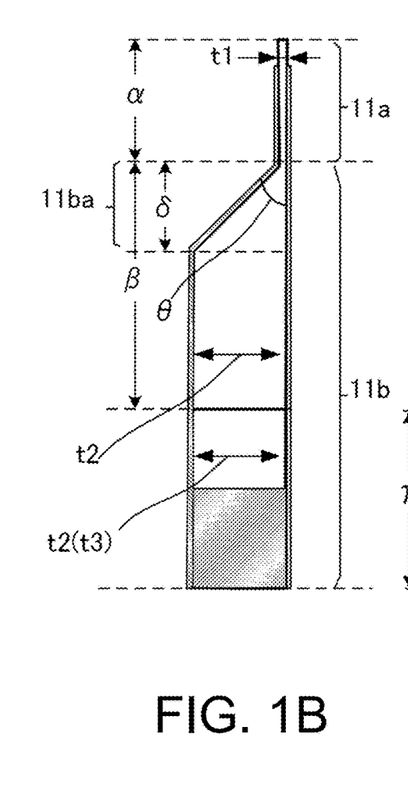
Figure 1C:
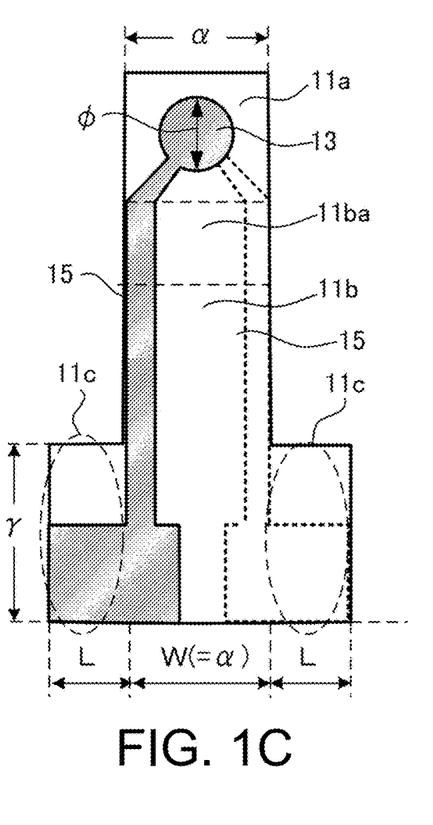

With reference to FIG. 1A to FIG. 1C, a quartz-crystal vibrating piece 10 of an embodiment of a first aspect will be described. Here, FIG. 1A is a perspective view of the quartz-crystal vibrating piece 10, FIG. 1B is a side view of the quartz-crystal vibrating piece 10, and FIG. 1C is a top view of the quartz-crystal vibrating piece 10.

The quartz-crystal vibrating piece 10 of the embodiment includes an element unit 11 including a vibrator 11a, a first thick portion 11b, and second thick portions 11c, excitation electrodes 13, and extraction electrodes 15. The vibrator 11a, the first thick portion 11b, and the second thick portions 11c are integrally formed, and for example, formed from an AT-cut crystal wafer by a photolithography technique. The following describes specific structures of respective parts.

The vibrator 11a has a quadrilateral shape in plan view, vibrates in a thickness-shear mode, and has a thickness t1. When the element unit 11 itself is configured of an AT-cut crystal element, the vibrator 11a is also configured of the AT-cut crystal element.

While the planar shape of the vibrator 11a may be a square shape or a rectangular shape, a square-shaped one having one side with a length of $\alpha$ is used in this embodiment. The dimension $\alpha$ is determined corresponding to the design of the vibrator 11a. The thickness t1 of the vibrator 11a is a thickness corresponding to an oscillation frequency required for the quartz-crystal vibrating piece 10. That is, when the required oscillation frequency is, for example, 460 MHz, the thickness t1 is approximately 3.5 µm, and it is considerably thin. However, this thickness is indicated with a value without considering a mass load of the excitation electrode 13. When the thickness t1 of the vibrator 11a is considerably thin, the excessively large dimension $\alpha$ causes a deficiency, such as a deflection of a vibrator 11a itself. Therefore, the upper limit of the dimension $\alpha$ is preferred to be determined in consideration of this respect. When the required oscillation frequency is, for example, 460 MHz, for example, the upper limit of the dimension $\alpha$ of the vibrator 11a is preferably about 0.5 mm, more preferably about 0.4 mm, although not limited thereto.

The first thick portion 11b has a rectangular shape in plan view, has a short side connected to one side of the vibrator 11a, extends along a first direction D1, and has a thickness t2 thicker than the thickness t1 of the vibrator 11a.

Here, a dimension $\beta$ along the first direction D1 of a portion of the first thick portion 11b excluding a portion in contact with the second thick portions 11c is configured to be a dimension meeting $\beta > \alpha$. In the case of $\beta > \alpha$, compared with the other case, since the vibrator 11a can be spaced from the second thick portions 11c by at least a distance $\alpha$, the mutual interference between the second thick portions 11c secured to an external member and the vibrator 11a is easily reduced, and it is preferred. The larger dimension $\beta$ is preferred because the vibrator 11a can be more spaced from the second thick portions 11c, but the upper limit of the dimension $\beta$ is determined in consideration of the whole dimension in the first direction required for the quartz-crystal vibrating piece.

In this embodiment, one surface of the vibrator 11a and one surface of the first thick portion 11b constitute a continuous flat surface. With this structure, for the formation of the vibrator 11a, it is only necessary to etch a planned region for forming the vibrator 11a of a crystal wafer (not illustrated) from one surface of the crystal wafer until a remaining thickness becomes t1, and it is preferred.

In this embodiment, the first thick portion 11b includes an inclined portion 11ba having a thickness gradually thinned toward the vibrator 11a in the vibrator 11a side. When the inclined portion 11ba is provided, the mutual interference between a portion excluding the inclined portion 11ba of the first thick portion 11b and the vibrator 11a is easily reduced compared with the other case. A step may be provided instead of the inclined portion.

An angle $\theta$ is formed between an inclined surface of the inclined portion 11ba and the flat surface formed by the vibrator 11a and the first thick portion 11b. In this case, the range is $\theta = 35 \pm 3$ degrees. Since the inclined surface having the angle $\theta$ is also a surface derived from a crystal face of quartz-crystal generated in the formation of the quartz-crystal vibrating piece 10 by a photolithography technique and a wet etching technique, the inclined surface having the angle $\theta$ contributes to forming the inclined portion with controllability.

The thickness t2 of the portion other than the inclined portion 11ba of the first thick portion 11b is preferably an appropriate thickness in consideration of reduction of a stress on the vibrator 11a, a better seating of the element unit 11 itself connected and fixed to a container (see FIG. 3), and the like. Relative to the thickness t1 of the vibrator 11a, the thickness t2 of the first thick portion 11b is preferably a thickness, for example, meeting $t2 \geq 10 \cdot t1$, and more preferably a thickness meeting $t2 \geq 15 \cdot t1$, although not limited thereto. The upper limit of the thickness t2 is determined depending on an internal height of a container in which the quartz-crystal vibrating piece 10 is mounted, an economical thickness of the crystal wafer used for the manufacture of the quartz-crystal vibrating piece 10, and the like.

It is preferred that a dimension $\delta$ along a first direction D1 of the inclined portion 11ba is long to some extent because the vibrator 11a can be spaced from the first thick portion 11b. For example, $\delta > t2$ is preferred. However, the upper limit of the dimension $\delta$ is determined in consideration of the whole dimension in the first direction D1 of the quartz-crystal vibrating piece 10, the thickness of the crystal wafer to form the quartz-crystal vibrating piece 10, the required oscillation frequency, and the like.

The second thick portions 11c are connected both side surfaces of an end portion of the first thick portion 11b in the opposite side of the vibrator 11a, and each extend along a second direction D2 intersecting with the first direction D1. Moreover, the second thick portions 11c have a thickness t3 thicker than the thickness t1 of the vibrator 11a and same as or different from the thickness t2 of the first thick portion, and the second thick portions 11c are used for connecting between the quartz-crystal vibrating piece 10 and, for example, a container (see FIG. 3 and the like) as an external member.

Here, a direction in which the first direction D1 intersects with the second direction D2 is configured to be, in this embodiment, a direction in which the first direction D1 is perpendicular to the second direction D2. When the first direction D1 and the second direction D2 are perpendicular to one another, and the quartz-crystal vibrating piece 10 is an AT-cut crystal element, the first direction D1 is preferably a direction parallel to an X-axis of a crystallographic axis of quartz-crystal, and the second direction D2 is preferably is a direction parallel to a Z'-axis of the crystallographic axis of the quartz-crystal. That is, a direction in which what is called an X-long quartz-crystal vibrating piece is obtained as the quartz-crystal vibrating piece 10 is preferred. On the contrary, the first direction D1 may be a direction parallel to the Z'-axis and the second direction D2 may be a direction parallel to the X-axis. That is, it may be a direction in which what is called a Z-long quartz-crystal vibrating piece is obtained as the quartz-crystal vibrating piece 10. The first direction D1 and the second direction D2 may intersect with one another at a non-perpendicular angle.

The second thick portion 11c of the embodiment is connected to the first thick portion 11b with a dimension γ along the first direction D1, extends in the second direction with a dimension L, and has a quadrilateral shape in plan view. Here, the dimension L preferably meets L≥0.5 W relative to a width W in the second direction of a portion in contact with the second thick portion 11c of the first thick portion 11b (in this embodiment, a dimension same as the length α of one side of the vibrator 11a). This is because the longer the dimension L is, the more the portion connected to the external member of the second thick portion 11c can be spaced from the vibrator 11a. The upper limit of the dimension L is preferably determined, for example, in consideration of a limitation of the dimension in the second direction D2 of the quartz-crystal vibrating piece 10. While the lengths L of the second thick portions 11c disposed in the right and the left of the first thick portion 11b are same in this embodiment, they may be different from one another.

The dimension γ preferably meets γ<β relative to the dimension β of the first thick portion 11b. Meeting γ<β is preferred because the connection width γ of the second thick portion 11c to the first thick portion 11b can be specified relative to the dimension β with a predetermined relation. However, when the dimension γ is small, the strength of the second thick portion 11c as a securing portion cannot be ensured, and therefore, the lower limit of the dimension γ is equal to or more than a dimension with which the above-described strength can be ensured.

The second thick portions 11c have the thickness t3 thicker than the thickness t1 of the vibrator 11a and same as or different from the thickness t2 of the first thick portion 11b. When the thickness of the second thick portion 11c is the thickness t3, the thickness t3 may be thicker or thinner than the thickness t2 of the first thick portion 11b on the premise that the thickness t3 is thicker than the thickness t1 of the vibrator 11a. However, in this embodiment, the thickness t1 of the vibrator 11a, the thickness t2 of the first thick portion 11b, and the thickness t3 of the second thick portion 11c meet t1<<t2=t3.

The excitation electrodes 13 are disposed on both front and back sides of the vibrator 11a. A planar shape of the excitation electrode 13 may be any given preferred shape corresponding to the design, for example, a quadrilateral shape, a circular shape, and an elliptical shape, and in this embodiment, the excitation electrode 13 has a circular shape in plan view having a diameter φ. The excitation electrode 13 has a plane area smaller than the vibrator 11a having the square shape in plan view (φ<α), and disposed on both front and back sides of the vibrator 11a in a manner in which the center points are matched to one another, the size is same between the front and back sides, and the front and back sides are mutually opposed. However, the excitation electrode 13 may be disposed such that the center point of the excitation electrode 13 is displaced from the center point of the vibrator 11a by a predetermined dimension in what is called an eccentric state. The excitation electrode 13 can be configured of any given preferred metal film.

The extraction electrode 15 is disposed from the excitation electrode 13 to the second thick portion 11c via the first thick portion 11b. Moreover, the extraction electrode 15 is disposed in an end region in the short side direction of the first thick portion 11b along the first direction D1. While the extraction electrodes 15 are disposed on both front and back sides of the vibrator 11a to extend from the excitation electrodes 13 to the respective second thick portions 11c, the extraction electrode disposed on the flat surface in which the vibrator 11a is continuous with the first thick portion 11b is extended to an opposite surface of the second thick portion 11c via a side surface of the second thick portion 11c. This is for convenience in connecting and fixing an electrode included in a container to configure a crystal unit (details will be described below) to the extraction electrode 15 with a conductive adhesive or the like. The extraction electrode 15 can be formed of any given preferred metal film, and typically, integrally formed with the excitation electrode 13.

2. Working Example of Quartz-Crystal Vibrating Piece

As a working example of the quartz-crystal vibrating piece 10, a quartz-crystal vibrating piece having dimensions of main parts as exemplified below was experimentally produced.

The dimension α of the one side of the vibrator 11a was 0.4 mm, the dimension β of the first thick portion 11b other than the portion in contact with the second thick portion 11c was 0.7 mm, the dimension γ of the second thick portion 11c in contact with the first thick portion 11b was 0.3 mm, the dimension L in the second direction D2 of the second thick portion 11c was 0.2 mm, the dimension W along the second direction D2 of the portion in contact with the second thick portion 11c of the first thick portion 11b was 0.4 mm (that is, the same as the dimension α), the dimension δ of the inclined portion was 0.07 mm, the thickness t1 of the vibrator 11a was a thickness corresponding to the oscillation frequency of 460 MHz (fundamental wave), the thickness t2 of the first thick portion 11b and the thickness t3 of the second thick portion 11c were each 0.05 mm, the diameter φ of the excitation electrode 13 was 0.1 mm, and the angle θ was about 35 degrees. A large number of the above-described quartz-crystal vibrating pieces were experimentally produced.

The above-described dimension values are target dimensions. In the examination with the target dimensions, β>α is met with β=α·0.7/0.4=1.75·α. γ<β is met with γ=β·0.3/0.7=0.43·β. L=W·0.2/0.4=0.5·W is met. δ>t2 is met with δ=t2·0.07/0.05=1.4·t2. Since the dimension δ is 0.07 mm, and the thickness t2 is 0.05 mm, the angle θ meets 0.05/0.07≈0.714≈35.5 degrees.

The experimentally produced quartz-crystal vibrating piece is hereinafter referred to as an experimentally produced quartz-crystal vibrating piece 10x. In a plurality of the experimentally produced quartz-crystal vibrating pieces 10x, each of the dimensions α,β, γ, δ, and L was a dimension in a range of 1% as a predetermined tolerance.

A crystal unit was produced using the experimentally produced quartz-crystal vibrating piece 10x, and an oscillation frequency change over time and a drive current change over time of the crystal unit were examined. This will be described in detail in the next section of embodiment of crystal unit.

An analytical model for a finite element method was produced based on the shape dimensions of the experimentally produced quartz-crystal vibrating piece 10x, and a stress distribution was analyzed in a structure in which this model was fixed at a portion corresponding to the second thick portion in a ceramic package with a polyimide-based conductive adhesive. The analysis was performed by examining a stress distribution generated in the analytical model when the temperature of the analytical model was changed from room temperature (25° C.) to 125° C.

Figure 2:
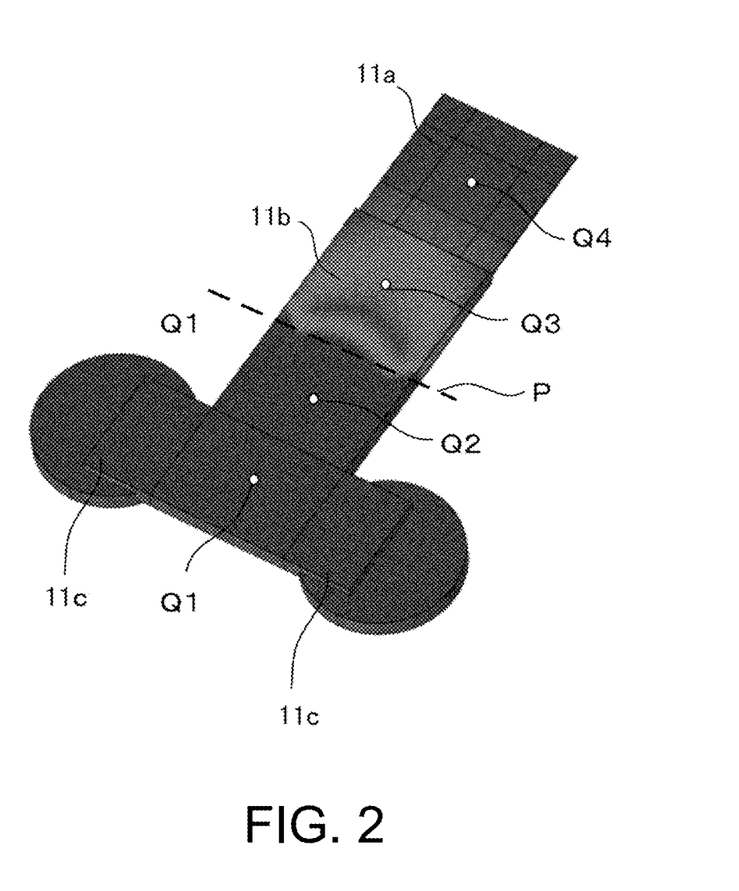
FIG. 2 illustrates an analysis result of a finite element method for describing a degree of an influence of a stress on the quartz-crystal vibrating piece 10 of the embodiment of the first aspect.

FIG. 2 is a drawing illustrating the analyzed stress distribution. In FIG. 2, the darker gray is, the larger the influence of the stress at the adhesive portion. As specific values, a von Mises stress at a center Q1 in a region in contact with the second thick portions 11c of the first thick portion 11b is 4.8E+7 (10 to the 7th power). The von Mises stress at a center Q2 in a region in the second thick portions 11c side from a center line P of the first thick portion 11b excluding the region in contact with the second thick portions 11c is 3.5E+6. The von Mises stress at a center Q3 in a region in the vibrator 11a side from the center line P of the first thick portion 11b excluding the region in contact with the second thick portions 11c is 2.8E+5. The von Mises stress at a center Q4 of the vibrator 11a is 2.6E+4. It is seen that the stress at the vibrator 11a is smaller than the stress in the region in contact with the second thick portions 11c of the first thick portion 11b by three orders of magnitude. Moreover, it is seen that in the first thick portion 11b, the influence of the stress decreases toward the vibrator 11a from near the center P (see FIG. 2) in the longitudinal direction of the first thick portion 11b. From these points, it is seen that the stress in the portion of the vibrator 11a is small compared with the other portions. Since it can be said that the stress from the supporting portion decreases at around the center in the first direction D1 of the first thick portion 11b, that is, about $\beta/2 \approx \alpha$, it is seen also from this point that meeting $\beta > \alpha$ is preferred.

3. Embodiment of Aspect of Crystal Unit

Figure 3:
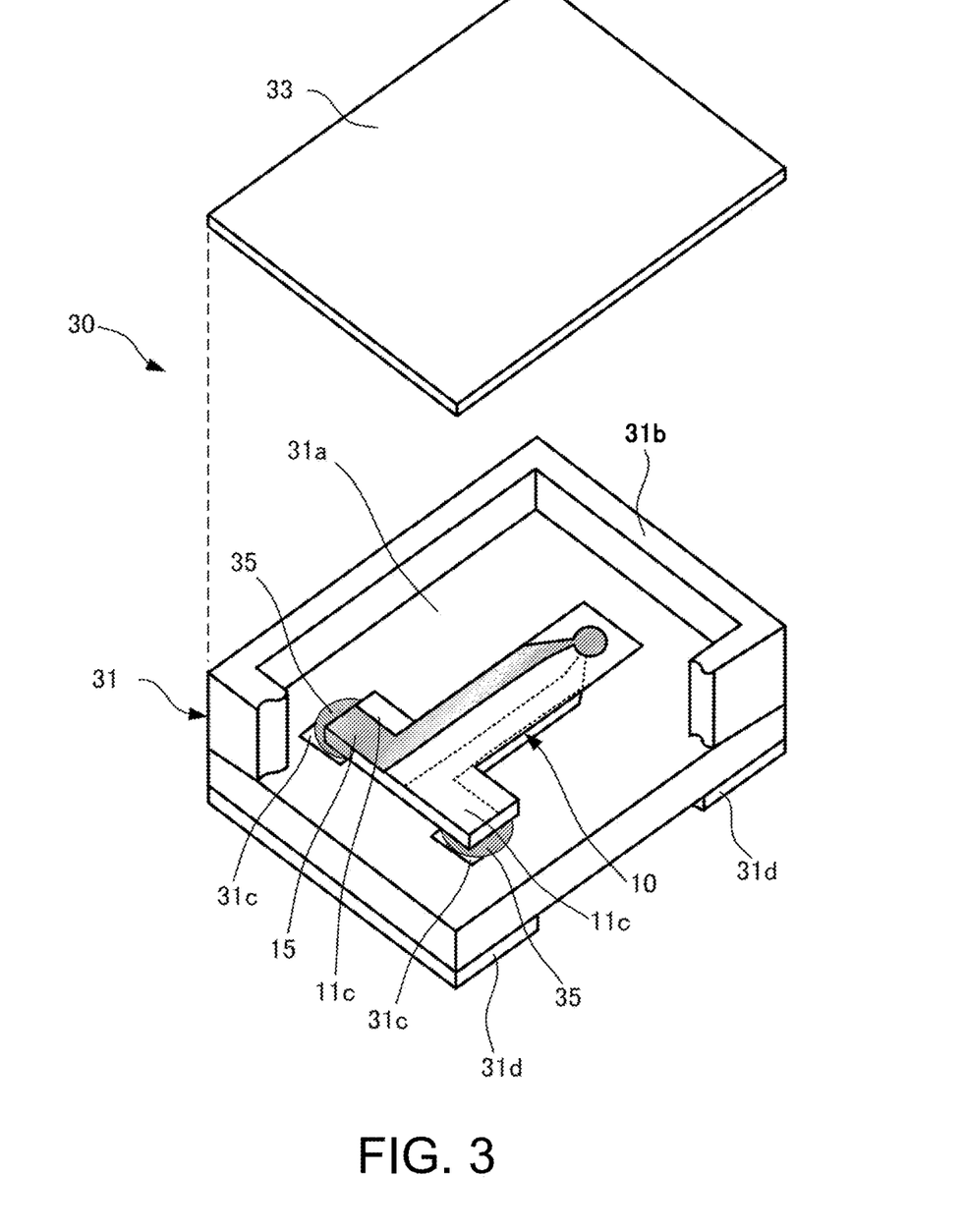
FIG. 3 is a drawing for describing a crystal unit 30 of an embodiment of a second aspect.

Next, an embodiment of a crystal unit as a second aspect of this application will be described. FIG. 3 is a perspective view for describing a crystal unit 30 of the embodiment, and is a perspective view illustrated by partially cutting away a container 31 included in the crystal unit 30.

The crystal unit 30 of the embodiment includes the quartz-crystal vibrating piece 10 of the first aspect, the container 31 that houses the quartz-crystal vibrating piece 10, and a lid member 33 that seals the container 31. The quartz-crystal vibrating piece 10 is electrically connected and fixed to the container 31 at the second thick portions 11c.

In this embodiment, the container 31 is provided with a depressed portion 31a in which the quartz-crystal vibrating piece 10 is housed, a wall portion 31b surrounding the depressed portion 31a, adhesion pads 31c disposed at positions corresponding to the second thick portions 11c of the quartz-crystal vibrating piece 10 on a bottom surface of the depressed portion 31a, and external connecting terminals 31d externally disposed on the bottom surface of the container 31. The adhesion pads 31c are connected to the external connecting terminals 31d by via-wirings or the like (not illustrated). The container 31 can be configured of, for example, a ceramic package.

The quartz-crystal vibrating piece 10 is connected and fixed to the adhesion pads 31c of the container 31 with a conductive adhesive 35 at the positions of the extraction electrodes 15 of the second thick portions 11c. Then, the crystal unit 30 of the embodiment is configured by sealing an opening of the depressed portion 31a with the lid member 33. The structure and the shape of the lid member 33 can be chosen corresponding to the sealing method. In this embodiment, the lid member 33 is configured of a flat plate-shaped member.

A plurality of crystal units were experimentally produced using the experimentally produced quartz-crystal vibrating piece 10x as the quartz-crystal vibrating piece 10 embedded into the crystal unit 30 described with reference to FIG. 3. Then, the experimentally produced crystal units were left to be non-operated in an oven set to the temperature at 125° C., and extracted from the oven at approximate timings, and changes over time of the frequency and the drive current were each measured.

Figure 4A:
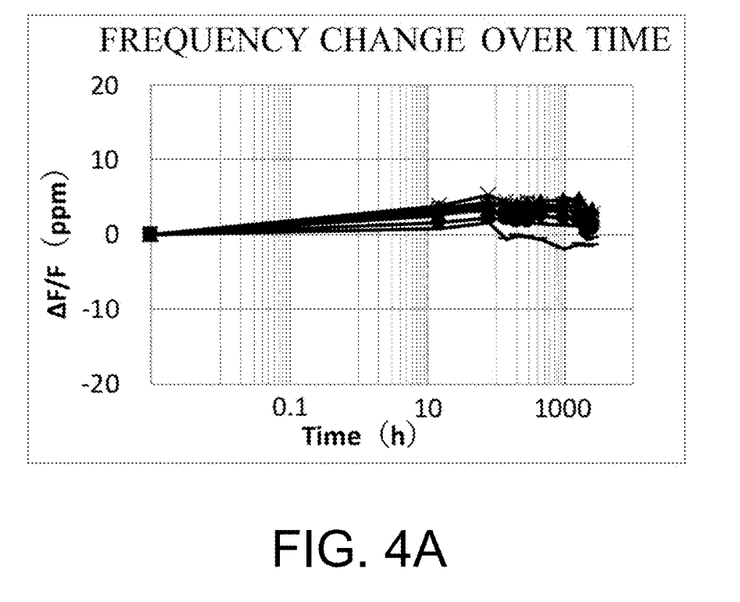
FIG. 4A is a drawing for describing characteristics of an oscillation frequency change over time of a crystal unit experimentally produced using the quartz-crystal vibrating piece 10 of the embodiment of the first aspect.
Figure 4B:
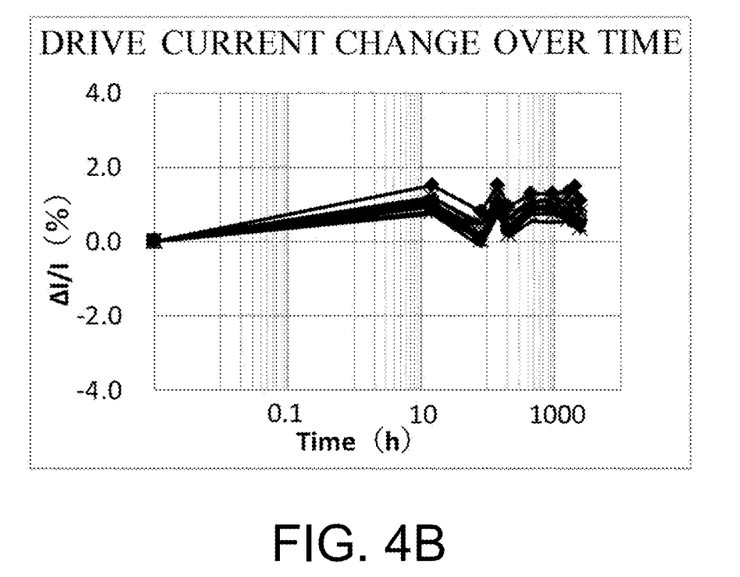
FIG. 4B is a drawing for describing characteristics of a drive current change over time of the crystal unit.

FIG. 4A is a drawing illustrating the frequency change over time in the above-described test, and FIG. 4B is a drawing illustrating the drive current change over time in the above-described test. In both drawings, the horizontal axis indicates the elapsed time, and the vertical axis indicates the change rate of data relative to an initial value in each measurement, that is, a frequency change rate (ppm) or a current change rate (%). From both drawings, it is seen that at a time point at which about 2500 hours has elapsed after the start of the test, the frequency change rate is ±5 ppm and the change rate tends to decrease, and the drive current change rate is about 1% and tends to saturate. Therefore, it is seen that the experimentally produced crystal unit exhibits practical characteristics.

While a container with a depressed portion is used as the container 31, and a flat plate-shaped one is used as the lid member 33 in the above-described configuration, a flat plate-shaped one may be used as the container, and a cap-shaped lid member with a depressed portion to house the quartz-crystal vibrating piece may be used as the lid member.

4. Embodiment of Aspect of Crystal Controlled Oscillator

Figure 5:
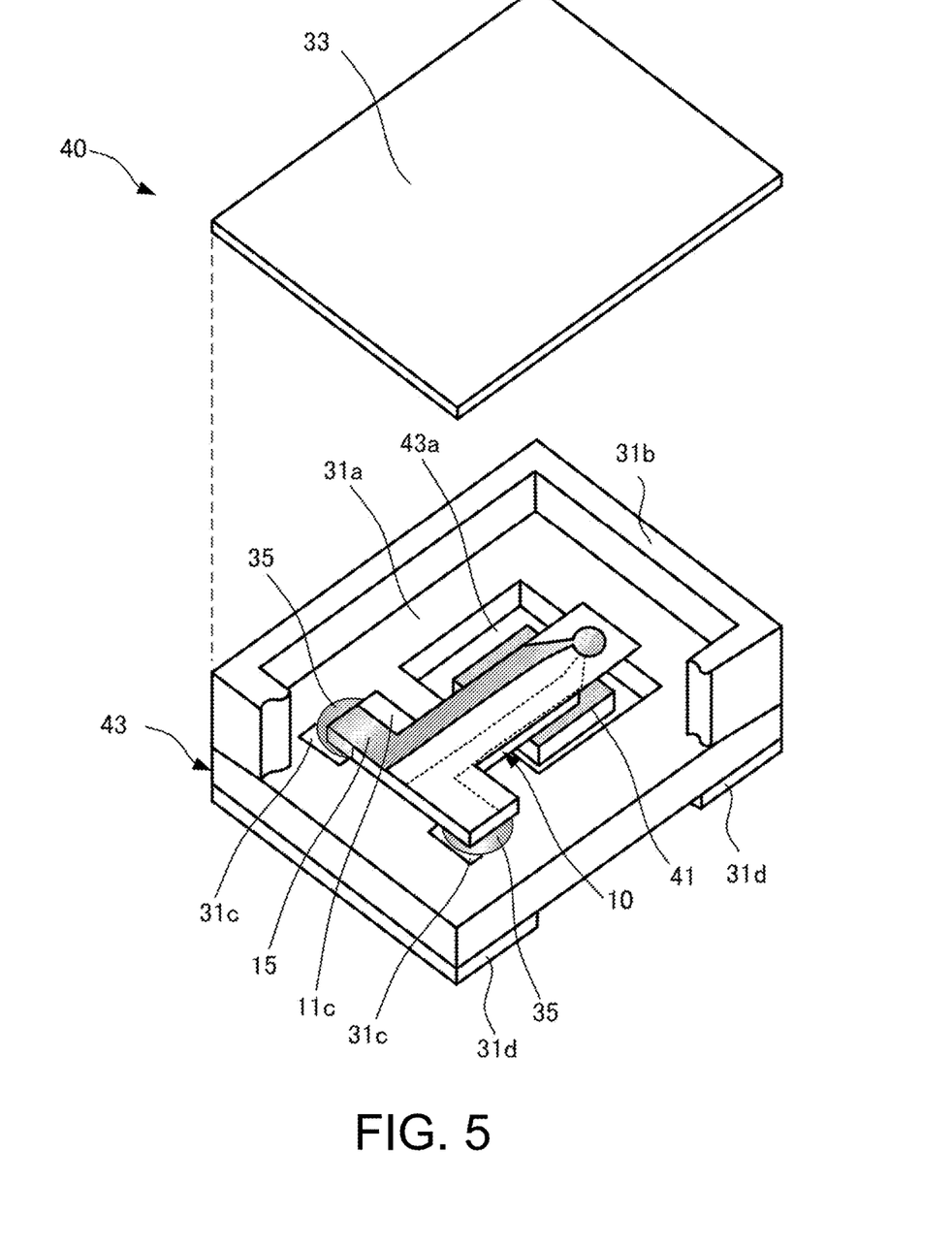
FIG. 5 is a drawing for describing a crystal controlled oscillator 40 of an embodiment of a third aspect.

Next, an embodiment of a crystal controlled oscillator as a third aspect of this application will be described. FIG. 5 is a perspective view for describing a crystal controlled oscillator 40 of the embodiment, and is a perspective view illustrated by partially cutting away a container 43 included in the crystal controlled oscillator 40.

The crystal controlled oscillator 40 of the embodiment includes the quartz-crystal vibrating piece 10 of the first aspect, an oscillator circuit 41 for the quartz-crystal vibrating piece, the container 43 that houses the quartz-crystal vibrating piece 10 and the oscillator circuit 41, and the lid member 33 that seals the container 43. The quartz-crystal vibrating piece 10 is electrically connected and fixed to the container 43 at the second thick portions 11c.

In this embodiment, the container 43 is provided with a second depressed portion 43a to house the oscillator circuit 41 at the bottom surface of the depressed portion 31a that houses the quartz-crystal vibrating piece 10. The other structure is similar to the structure of the above-described container 31.

The oscillator circuit 41 may be any given preferred one, and may be configured of an integrated circuit having an oscillating function and a temperature compensation function, or the like.

In the above-described example, a crystal controlled oscillator of what is called a one-chamber structure, in which the quartz-crystal vibrating piece 10 and the integrated circuit including the oscillator circuit are mounted in one container, is described. However, although not illustrated, the present disclosure is applicable to a crystal controlled oscillator of what is called an H-type structure in which a crystal chamber that houses the quartz-crystal vibrating piece and an IC chamber that houses a semiconductor integrated circuit for an oscillator circuit are stacked.

5. Intermediate Wafer for Forming Crystal Resonator

Next, an embodiment of an intermediate wafer for forming a crystal resonator as a fourth aspect of this application will be described.

Figure 6:
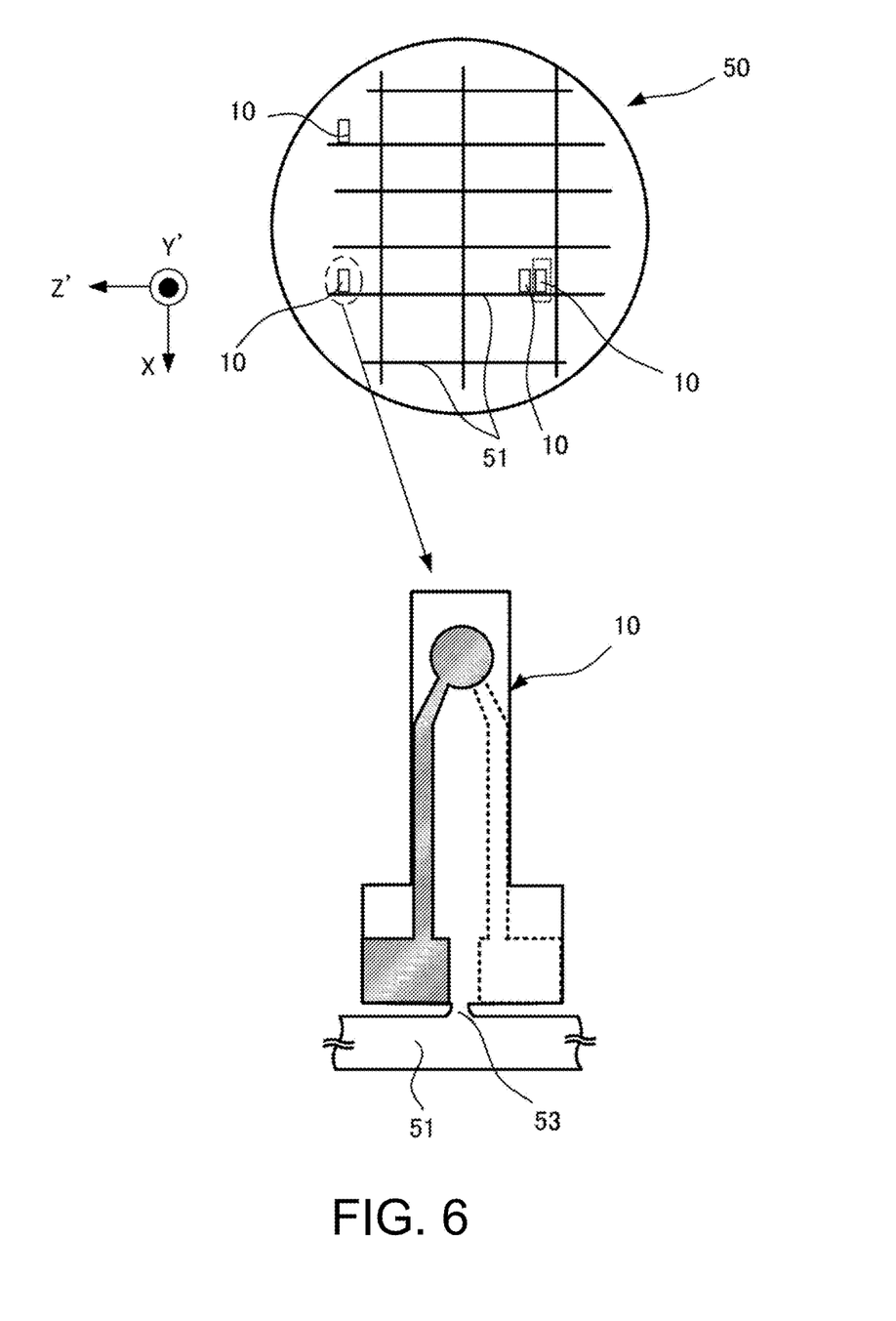
FIG. 6 is a drawing for describing an intermediate wafer 50 for a quartz-crystal vibrating piece of an embodiment of a fourth aspect.

FIG. 6 is a top view for describing an intermediate wafer 50 for forming a crystal resonator (hereinafter abbreviated as intermediate wafer 50) of the embodiment and its partially enlarged view. FIG. 6 illustrates a crystal wafer as the intermediate wafer 50 with a relation between crystallographic axes of quartz-crystal of an X-axis, Y'-axis, and Z'-axis.

The intermediate wafer 50 of the embodiment is configured of a crystal wafer 50 including a large number of the quartz-crystal vibrating pieces 10 of the first aspect in a matrix. While the intermediate wafer 50 has a circular planar shape in the drawing, the planar shape may be a quadrilateral shape. In the intermediate wafer 50, each of the quartz-crystal vibrating pieces 10 is connected to a frame portion 51 via a snap-off portion 53. The respective quartz-crystal vibrating pieces 10 are snapped off from the intermediate wafer 50 at the positions of the snap-off portions 53, diced to the quartz-crystal vibrating pieces 10, and further, can be used by being mounted to the containers of the crystal unit and the crystal controlled oscillator.

6. Modifications of Quartz-Crystal Vibrating Piece

The quartz-crystal vibrating piece of the first aspect may be modified, for example, as described below. FIG. 7A to FIG. 7E are explanatory drawings thereof, FIG. 7A to FIG. 7D are top views of crystal units in the respective modifications, and FIG. 7E is a side view of a crystal unit of a modification.

Figure 7A:
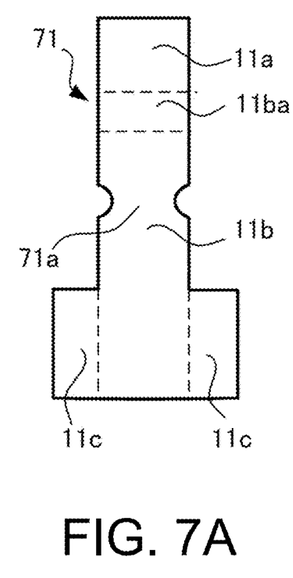
FIG. 7A to FIG. 7E are drawings for describing Modification 1 to Modification 5 of the quartz-crystal vibrating piece of the first aspect.

As illustrated in FIG. 7A, a quartz-crystal vibrating piece 71 of Modification 1 is provided with cutouts from the right and the left toward the center along a short side direction at an appropriate position in the longitudinal direction of the first thick portion 11b, and a portion between the cutouts is formed as a narrowed portion 71a. While one narrowed portion 71a is provided in the drawing, a plurality of the narrowed portions 71a may be provided.

Figure 7B:
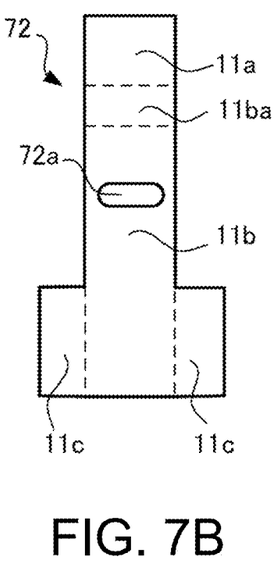

As illustrated in FIG. 7B, a quartz-crystal vibrating piece 72 of Modification 2 is provided with a through hole 72a at an appropriate position in the longitudinal direction of the first thick portion 11b. While one through hole 72a is provided in the drawing, a plurality of the through holes 72a may be provided.

Figure 7C:
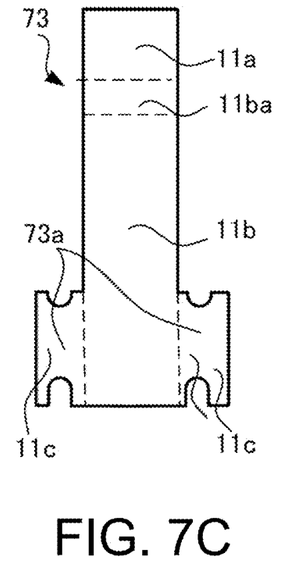

As illustrated in FIG. 7C, a quartz-crystal vibrating piece 73 of Modification 3 is provided with cutouts from upper and lower sides toward the center along the longitudinal direction of the first thick portion 11b at each of the second thick portions 11c, and a portion between the cutouts is formed as a narrowed portion 73a. A plurality of numbers of the narrowed portions 73a may be provided.

Figure 7D:
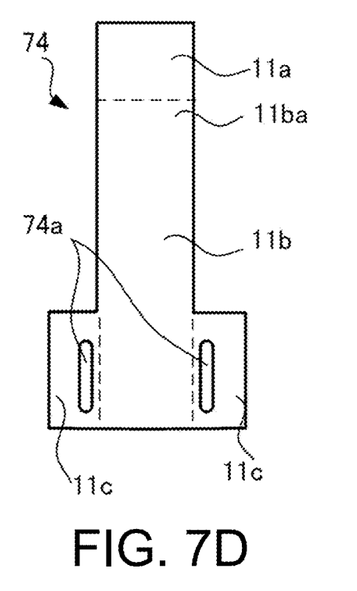
Figure 7E:
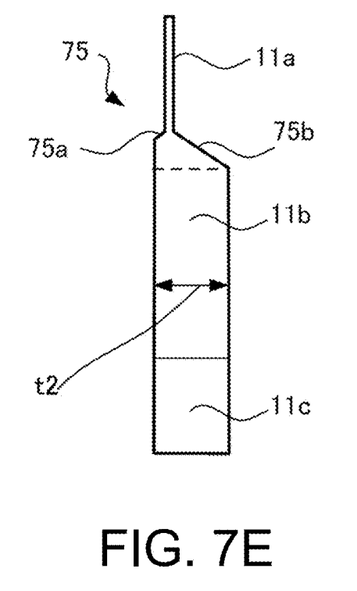

As illustrated in FIG. 7D, a quartz-crystal vibrating piece 74 of Modification 4 is provided with a through hole 74a at an appropriate position of the second thick portion 11c. A plurality of numbers of the through holes 74a may be provided.

In each of Modification 1 to Modification 4, since the narrowed portion or the through hole is provided between the vibrator 11a and the connection point with the external member of the second thick portion 11c, the mutual interference with the connection point with the external member of the second thick portion 11c is considered to be easily reduced.

A quartz-crystal vibrating piece 75 of Modification 5 is an example of a structure in which inclined portions 75a, 75b or step portions (not illustrated) are provided from both sides in the direction of the thickness t2 in the vibrator side of the first thick portion 11b, and the vibrator 11a is connected to the first thick portion 11b halfway in the thickness t2 of the first thick portion 11b. The connecting position of the vibrator 11a to the first thick portion 11b may be the middle in the direction along the thickness t2, and may be a position close to one side. In the case of Modification 5, since the vibrator 11a is connected to the first thick portion in a state where the inclined portions or the like are provided in both sides in the direction of the thickness t2, it is considered that edge cutting of the vibrator from the first thick portion is easily performed.

According to a second aspect of this disclosure, there is provided a crystal unit that includes the quartz-crystal vibrating piece according to the first aspect, and a container as the external member. The container houses the quartz-crystal vibrating piece. The quartz-crystal vibrating piece is electrically connected and fixed to the container at the second thick portions.

According to a third aspect of this disclosure, there is provided a crystal controlled oscillator that includes the quartz-crystal vibrating piece according to the first aspect, an oscillator circuit for the quartz-crystal vibrating piece, and a container as the external member. The container houses the quartz-crystal vibrating piece and the oscillator circuit. The quartz-crystal vibrating piece is electrically connected and fixed to the container at the second thick portions.

According to a fourth aspect of this disclosure, there is provided an intermediate wafer for forming a quartz-crystal vibrating piece. The intermediate wafer includes a crystal wafer including a large number of the quartz-crystal vibrating pieces according to the first aspect in a matrix.

To embody the first to the fourth aspects, in the quartz-crystal vibrating piece, when a dimension along the first direction of the vibrator is α, a dimension along the first direction of a portion of the first thick portion excluding a portion in contact with the second thick portions is β, a dimension along the first direction of a portion of the second thick portion in contact with the first thick portions is γ, a dimension along the second direction of a portion of the first thick portion in contact with the second thick portions is W, and a dimension along the second direction of the second thick portion is L, although details will be described in the embodiments below, there are preferably predetermined relations between a part of or all of these dimensions α, β, γ, W, and L. This allows reducing the mutual interference between the vibrator and the external member compared with the other case.

To embody the first to the fourth aspects, in the quartz-crystal vibrating piece, the first thick portion preferably includes an inclined portion having a thickness gradually thinned toward the vibrator in the vibrator side. When the inclined portion is provided, the mutual interference between the vibrator and the external member can be reduced compared with the other case.

The quartz-crystal vibrating piece of this disclosure can achieve the quartz-crystal vibrating piece having the structure in which the vibrator is spaced from the supporting portion of the container or the like by the first thick portion and the second thick portion intersecting with the first thick portion. Moreover, the quartz-crystal vibrating piece is connected to the outside via the second thick portion. From these points, the influence of the external stress on the vibrator can be reduced compared with conventional one. Accordingly, the quartz-crystal vibrating piece, the crystal unit, and the crystal controlled oscillator having the novel structure appropriate for achieving a high frequency quartz crystal device can be provided.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A quartz-crystal vibrating piece comprising:
    an element unit including:
        a vibrator that has a quadrilateral shape in plan view, vibrates in a thickness-shear mode, and has a thickness t1;
        a first thick portion that has a rectangular shape in plan view, has a short side connected to one side of the vibrator, extends in a first direction, and has a thickness t2 thicker than the thickness t1; and
        second thick portions connected to both side surfaces of an end portion of the first thick portion in an opposite side of the vibrator, each of the second thick portions extending along a second direction intersecting with the first direction and having a thickness t3 thicker than the thickness t1 and same as or different from the thickness t2, the second thick portions being used for connecting the quartz-crystal vibrating piece to an external member;
    excitation electrodes disposed on both front and back sides of the vibrator; and
    an extraction electrode provided from the excitation electrode to the second thick portion via the first thick portion,
    wherein,
    when a dimension along the first direction of the vibrator is a, and a dimension along the first direction of a portion of the first thick portion excluding a portion in contact with the second thick portions is β, β>α is met.

2. The quartz-crystal vibrating piece according to claim 1, wherein
    when a dimension along the first direction of a portion of the second thick portion in contact with the first thick portions is γ, γ<β is met.

3. The quartz-crystal vibrating piece according to claim 1, wherein
    when a dimension along the second direction of a portion of the first thick portion in contact with the second thick portions is W, and a dimension along the second direction of the second thick portion is L, L≥0.5 W is met.

4. The quartz-crystal vibrating piece according to claim 1, wherein
    when a dimension along the first direction of a portion of the second thick portion in contact with the first thick portions is γ, γ<β is met, and
    when a dimension along the second direction of a portion of the first thick portion in contact with the second thick portions is W, and a dimension along the second direction of the second thick portion is L, L≥0.5 W is met.

5. The quartz-crystal vibrating piece according to claim 1, wherein
    when a dimension along the first direction of a portion of the second thick portion in contact with the first thick portions is γ, γ<β is met,
    when a dimension along the second direction of a portion of the first thick portion in contact with the second thick portions is W, and a dimension along the second direction of the second thick portion is L, L≥0.5 W is met, and
    the thickness t2 meets t2≥10·t1 relative to the thickness t1.

6. The quartz-crystal vibrating piece according to claim 1, wherein
    the first thick portion includes an inclined portion having a thickness gradually thinned toward the vibrator in the vibrator side.

7. The quartz-crystal vibrating piece according to claim 1, wherein
    the first thick portion includes an inclined portion having a thickness gradually thinned toward the vibrator in the vibrator side, and
    when a dimension along the first direction of the inclined portion is defined as δ, the dimension δ meets δ>t2 relative to the thickness t2.

8. The quartz-crystal vibrating piece according to claim 1, wherein
    the first thick portion includes an inclined portion having a thickness gradually thinned toward the vibrator in the vibrator side,
    one surface of the vibrator and one surface of the first thick portion constitute a continuous flat surface, and
    an angle θ formed between an inclined surface of the inclined portion and the flat surface is θ=35±3 degrees.

9. The quartz-crystal vibrating piece according to claim 1, wherein
    when a dimension along the first direction of a portion of the second thick portion in contact with the first thick portions is γ, γ≤β is met,
    when a dimension along the second direction of a portion of the first thick portion in contact with the second thick portions is W, and a dimension along the second direction of the second thick portion is L, L≥0.5 W is met,
    the thickness t2 meets t2≥10·t1 relative to the thickness t1, and
    the first thick portion includes an inclined portion having a thickness gradually thinned toward the vibrator in the vibrator side.

10. A crystal unit comprising:
    the quartz-crystal vibrating piece according to claim 1; and
    a container as the external member, the container housing the quartz-crystal vibrating piece, and the quartz-crystal vibrating piece being electrically connected and fixed to the container at the second thick portions.

11. A crystal controlled oscillator comprising:
    the quartz-crystal vibrating piece according to claim 1;
    an oscillator circuit for the quartz-crystal vibrating piece; and
    a container as the external member, the container housing the quartz-crystal vibrating piece and the oscillator circuit, the quartz-crystal vibrating piece being electrically connected and fixed to the container at the second thick portions.

12. An intermediate wafer for forming a quartz-crystal vibrating piece, comprising a crystal wafer including a large number of the quartz-crystal vibrating pieces according to claim 1 in a matrix.

\* \* \* \* \*